United States Patent
Hsiao et al.

(10) Patent No.: US 7,682,902 B2
(45) Date of Patent: Mar. 23, 2010

(54) MEMORY STRUCTURE AND METHOD OF MAKING THE SAME

(75) Inventors: Ching-Nan Hsiao, Kaohsiung County (TW); Pei-Ing Lee, Chang-Hua Hsien (TW); Ming-Cheng Chang, Taipei County (TW); Chung-Lin Huang, Tao-Yuan (TW); Hsi-Hua Chang, Taoyuan County (TW); Chih-Hsiang Wu, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 258 days.

(21) Appl. No.: 11/949,786

(22) Filed: Dec. 4, 2007

(65) Prior Publication Data

US 2008/0305593 A1 Dec. 11, 2008

(30) Foreign Application Priority Data

Jun. 11, 2007 (TW) ............................... 96121018 A

(51) Int. Cl.
*H01L 21/336* (2006.01)
(52) U.S. Cl. ...................... 438/259; 438/270; 438/424; 438/589; 257/E21.545; 257/E21.693
(58) Field of Classification Search ................. 438/258, 438/261, 265–267, 270, 271–272, 287, 589, 438/206, 211, 212, 259, 296, 424; 257/330–334, 257/396–398, E21.585, E21.662, E21.68, 257/E21.681, E21.69, E21.691, 315, 314, 257/E21.419, E21.422, E21.429, E21.545, 257/E21.628, E21.633, E21.642, E21.655, 257/E21.693
See application file for complete search history.

(56) References Cited

U.S. PATENT DOCUMENTS

| | | | | | |
|---|---|---|---|---|---|
| 5,854,136 | A | * | 12/1998 | Huang et al. ................. | 438/714 |
| 6,534,365 | B2 | * | 3/2003 | Kim et al. .................... | 438/270 |
| 7,064,381 | B2 | * | 6/2006 | Koh ............................ | 257/315 |
| 7,563,677 | B2 | * | 7/2009 | Yoo et al. .................... | 438/259 |
| 2005/0139910 | A1 | * | 6/2005 | Koh ............................ | 257/330 |
| 2006/0017093 | A1 | * | 1/2006 | Kwon et al. ................. | 257/315 |
| 2006/0258096 | A1 | * | 11/2006 | Noble et al. ................. | 438/257 |
| 2007/0007586 | A1 | * | 1/2007 | Tempel ........................ | 257/330 |
| 2007/0215931 | A1 | * | 9/2007 | Kianian et al. .............. | 257/315 |
| 2008/0286697 | A1 | * | 11/2008 | Verhaverbeke et al. ....... | 430/322 |

FOREIGN PATENT DOCUMENTS

EP 908942 A2 * 4/1999

* cited by examiner

*Primary Examiner*—Matthew C Landau
*Assistant Examiner*—Joseph C Nicely
(74) *Attorney, Agent, or Firm*—Winston Hsu

(57) ABSTRACT

A memory structure disclosed in the present invention features a control gate and floating gates being positioned in recessed trenches. A method of fabricating the memory structure includes the steps of first providing a substrate having a first recessed trench. Then, a first gate dielectric layer is formed on the first recessed trench. A first conductive layer is formed on the first gate dielectric layer. After that, the first conductive layer is etched to form a spacer which functions as a floating gate on a sidewall of the first recessed trench. A second recessed trench is formed in a bottom of the first recessed trench. An inter-gate dielectric layer is formed on a surface of the spacer, a sidewall and a bottom of the second recessed trench. A second conductive layer formed to fill up the first and the second recessed trench.

8 Claims, 12 Drawing Sheets

MEMORY STRUCTURE AND METHOD OF MAKING THE SAME

BACKGROUND OF THE INVENTION

1. Field of the Invention

The present invention relates to a memory structure and a method of making the memory structure, and more particularly to a flash structure and a method of making the flash structure.

2. Description of the Prior Art

Flash memory is non-volatile computer memory that can be electrically erased and reprogrammed. It is a technology that is primarily used in memory cards and USB flash drives, which are used for general storage and transfer of data between computers and other digital products. As electronic devices become smaller, the size of the flash memory cells is shrinking as well. Today, in order to make the electronic devices with small size, increasing the integration of elements is a major issue.

FIG. 1 shows a structure of a two-bit flash memory cell according to the prior art. As shown in FIG. 1, the structure of the conventional two-bit flash memory cell comprises: a substrate 10, a control gate 12 positioned on the substrate 10, a floating gate 14 positioned at a sidewall of the control gate 12, a spacer 16 positioned on the floating gate 14, a dielectric layer 18 respectively positioned between the control gate 12 and the floating gate 14, and control gate 12 and the spacer 16 as well as on top of the substrate 10, and a gate oxide layer 20 positioned between the control gate 12 and the substrate 10.

The floating gate 14 of the flash memory cell mentioned-above is difficult to fabricate. Furthermore, since the size of the electronic device is shrinking, the short channel effect is formed because the gate channel length becomes short. Therefore, a new structure of the memory cell and a new method of making the memory cell are needed to overcome the short channel effect.

SUMMARY OF THE INVENTION

A memory structure disclosed in the present invention features a control gate and floating gates being positioned in recessed trenches to reduce the short channel effect.

According to the preferred embodiment of the present invention, a structure of a memory cell includes: a substrate, a first recessed trench positioned in the substrate, a second recessed trench positioned in the bottom of the first recessed trench, and the opening of the second recessed trench being smaller than the opening of the first recessed trench, wherein the sidewall of the first recessed trench and the sidewall of the second recessed trench form a step, a spacer serving as a floating gate positioned on the step, a gate dielectric layer positioned between the spacer and the substrate, a inter-gate dielectric layer positioned on the surface of the spacer and the surface of the second recessed trench, a conductive layer serving as a control gate positioned on the inter-gate dielectric layer and filling up the first recessed trench and the second recessed trench and a source/drain doping region positioned at a side of the spacer.

According to the preferred embodiment of the present invention, a method for fabricating a memory structure includes: first, a substrate having a first recessed trench is provided. Then, a first gate dielectric layer is formed on the first recessed trench. After that, a spacer which functions as a floating gate is formed on a sidewall of the first recessed trench. Later, a second recessed trench is formed in a bottom of the first recessed trench. An inter-gate dielectric layer is formed on a surface of the spacer, a sidewall and a bottom of the second recessed trench. A conductive layer is then formed to fill the first and the second recessed trench. A source/drain doping region is then formed in the substrate adjacent the spacer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
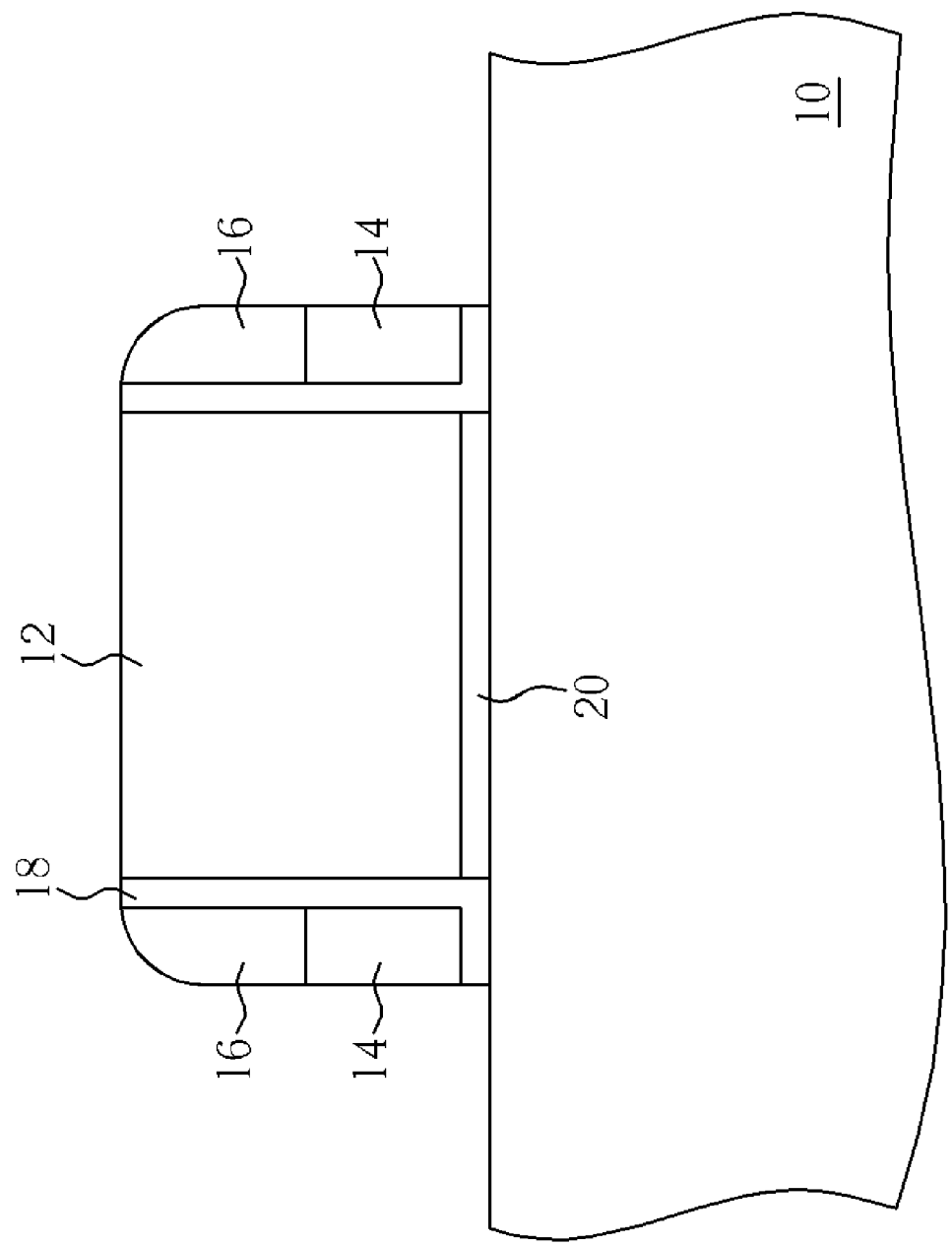
FIG. 1 illustrates a structure of a two-bit flash memory cell according to the prior art.
Figure 2:
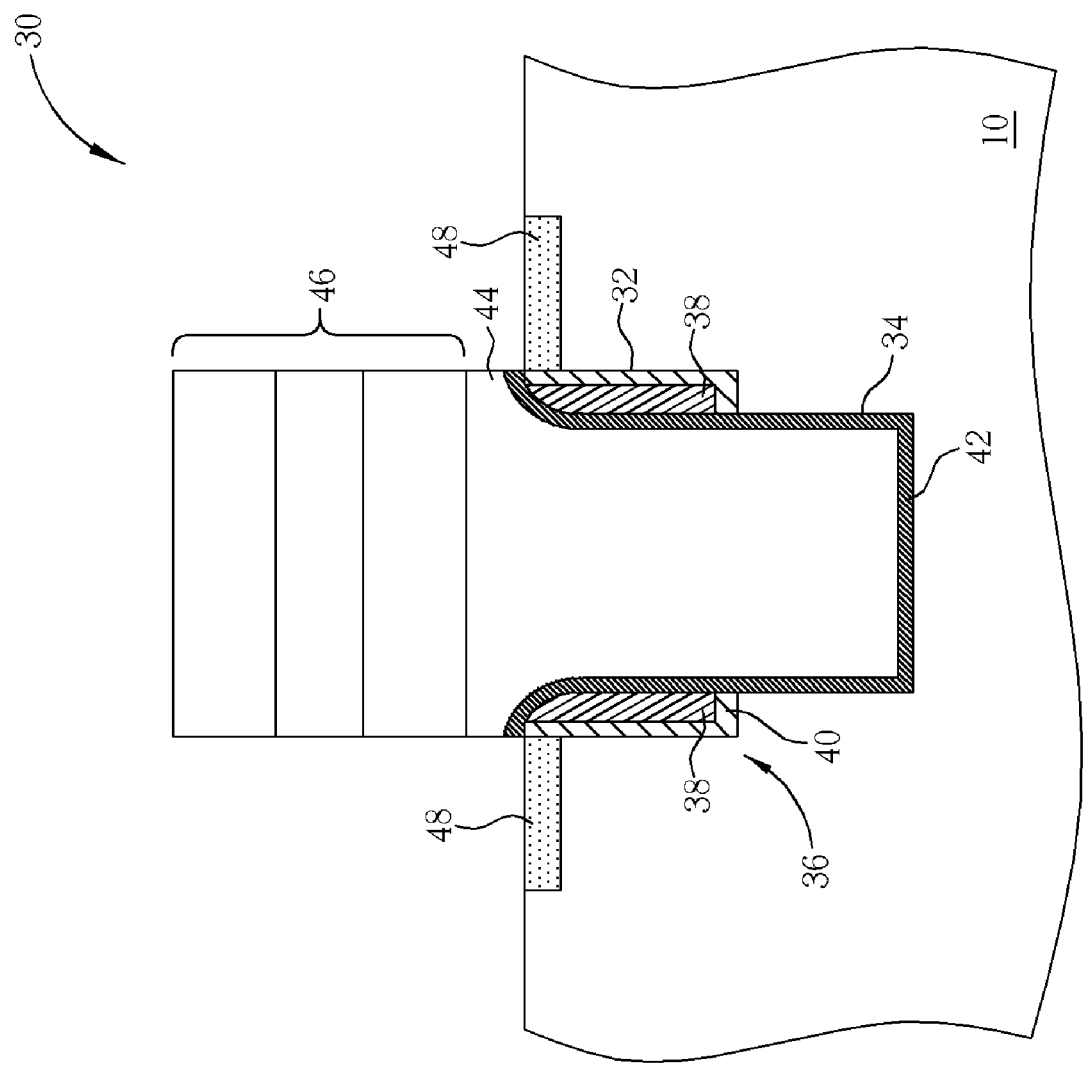
FIG. 2 illustrates a cross section of the flash structure according to the preferred embodiment of the present invention.

FIG. 2 depicts a cross section of the flash structure according to the preferred embodiment of the present invention. The memory structure 30 of the present invention includes: a substrate 10, a first recessed trench 32 positioned in the substrate 10, a second recessed trench 34 defined in a bottom of the first recessed trench 32 to communicate with the first recessed trench 32, wherein the second recessed trench 34 has a second width smaller than a first width of the first recessed trench 32 and wherein a sidewall of the second recessed trench 34 extends through the bottom face of the first recessed trench 32 such that a step 36 is formed between the sidewall of the first recessed trench 32 and the sidewall of the second recessed trench 34, a spacer 38 positioned on an outer periphery of the step 36, wherein the spacer 38 serves as a floating gate, a gate dielectric layer 40 sandwiched between the outer surface of the spacer 38 and the substrate 10, a inter-gate dielectric layer 42 positioned on the inner surface of the spacer 38 and the surface of the second recessed trench 34, a conductive layer 44 positioned on the inter-gate dielectric layer 42 and filling the first recessed trench 32 and the second recessed trench 34, wherein the conductive layer 44 serves as a control gate, a gate structure 46 positioned on the conductive layer 44, a source/drain doping region 48 positioned in the substrate 10 and be at a side of the spacer 38.

The substrate 30 may be Si, Ge, C—Si, silicon on insulator (SOI), Si—Ge on insulator, compound semiconductor, multilayer semiconductor or the combination thereof and the spacer 38 and the conductive layer 44 may be polysilicon. In addition, the spacer 38 serving as a floating gate is for electron storage, and the conductive layer 44 serving as a control gate is for turning on or off the gate channel. Furthermore, the inter-gate dielectric layer 42 contains silicon oxide, silicon nitride, silicon oxide/silicon nitride, silicon nitride/silicon oxide, or silicon oxide/silicon nitride/silicon oxide.

FIG. 3 to FIG. 12 depicts the method of fabricating a flash structure according to the preferred embodiment of the present invention.

Figure 3:
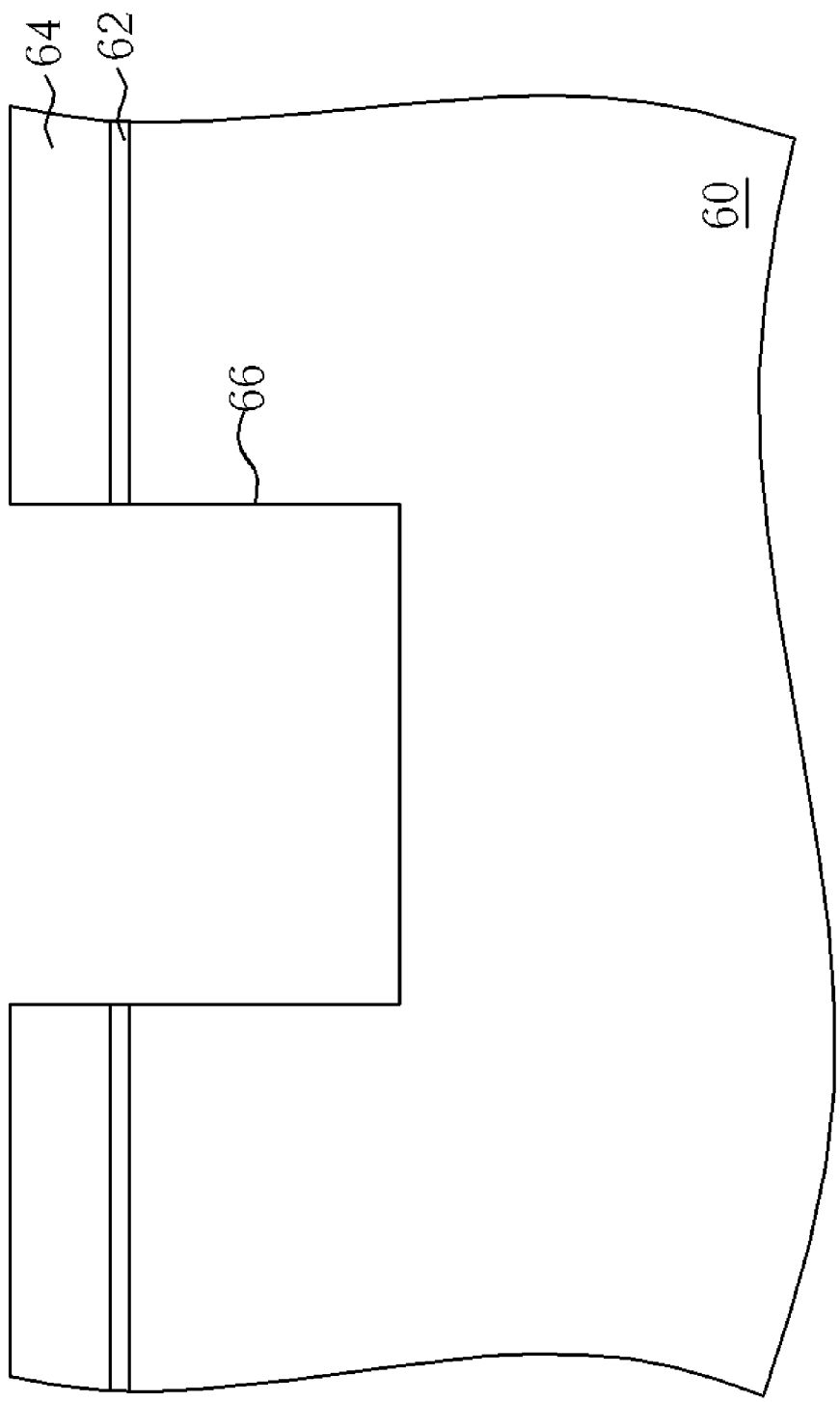
FIG. 3 to FIG. 12 illustrates the method of fabricating a flash structure according to the preferred embodiment of the present invention.

As shown in FIG. 3, a substrate 60 comprising a pad is provided. The pad comprises a pad oxide 62, a pad nitride 64 positioned on the pad oxide 62 and a mask layer (not shown), such as an oxide layer, positioned on the pad nitride 64. Then a first recessed trench 66 is formed in the substrate 60 and the pad.

Figure 4:
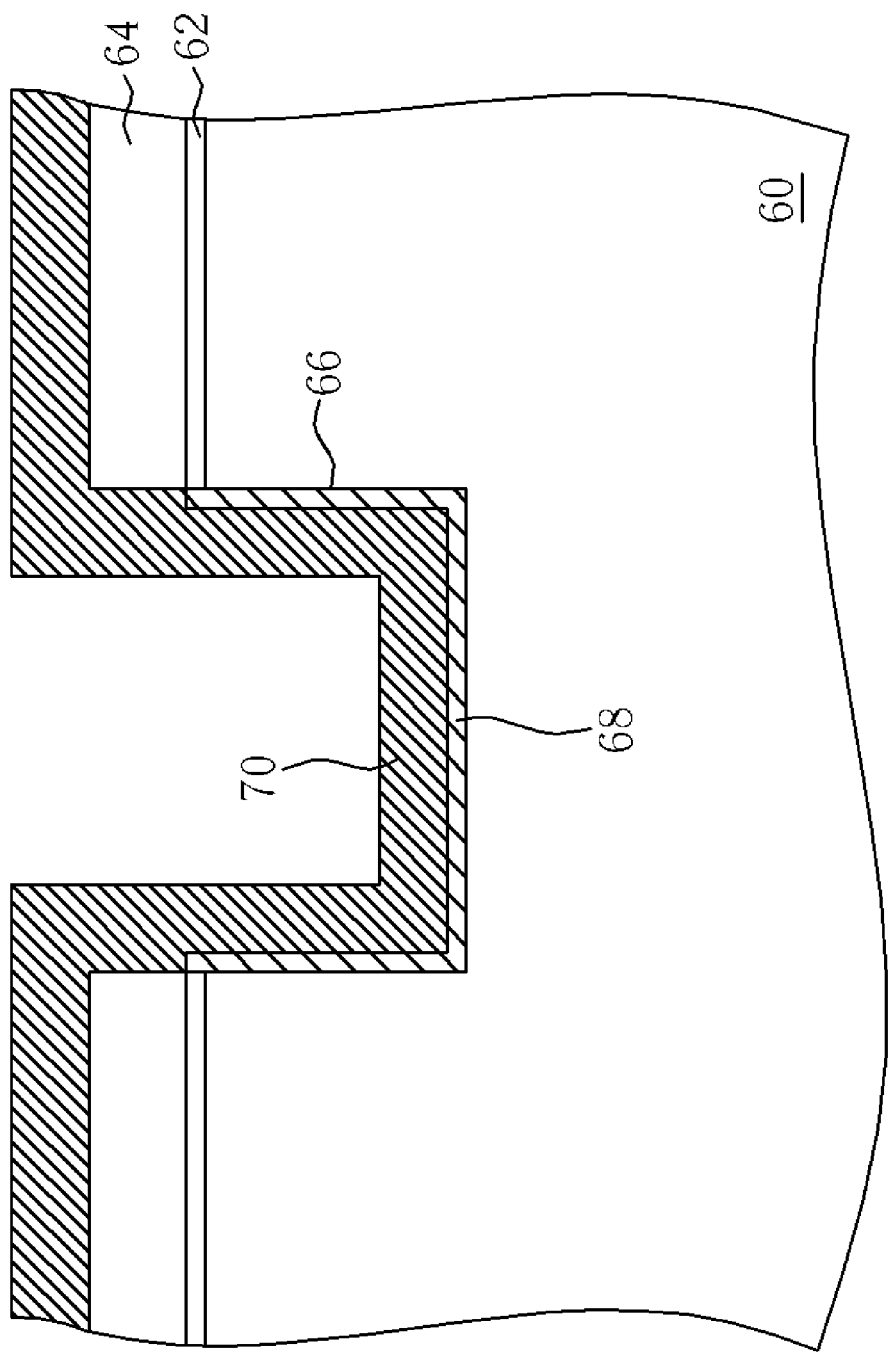

As shown in FIG. 4, a first gate dielectric layer 68 is formed on the surface of the first recessed trench 66. The method of forming the gate dielectric layer 68 includes a thermal oxidation process, but is not limited to this method. Then a conductive layer, such as a poysilicon layer 70, is formed on the surface of the gate dielectric layer 68 and the surface of the pad nitride 64, wherein the method of forming the gate dielectric layer 68 can be a chemical vapor deposition process, but is not limited to this method.

Figure 5:
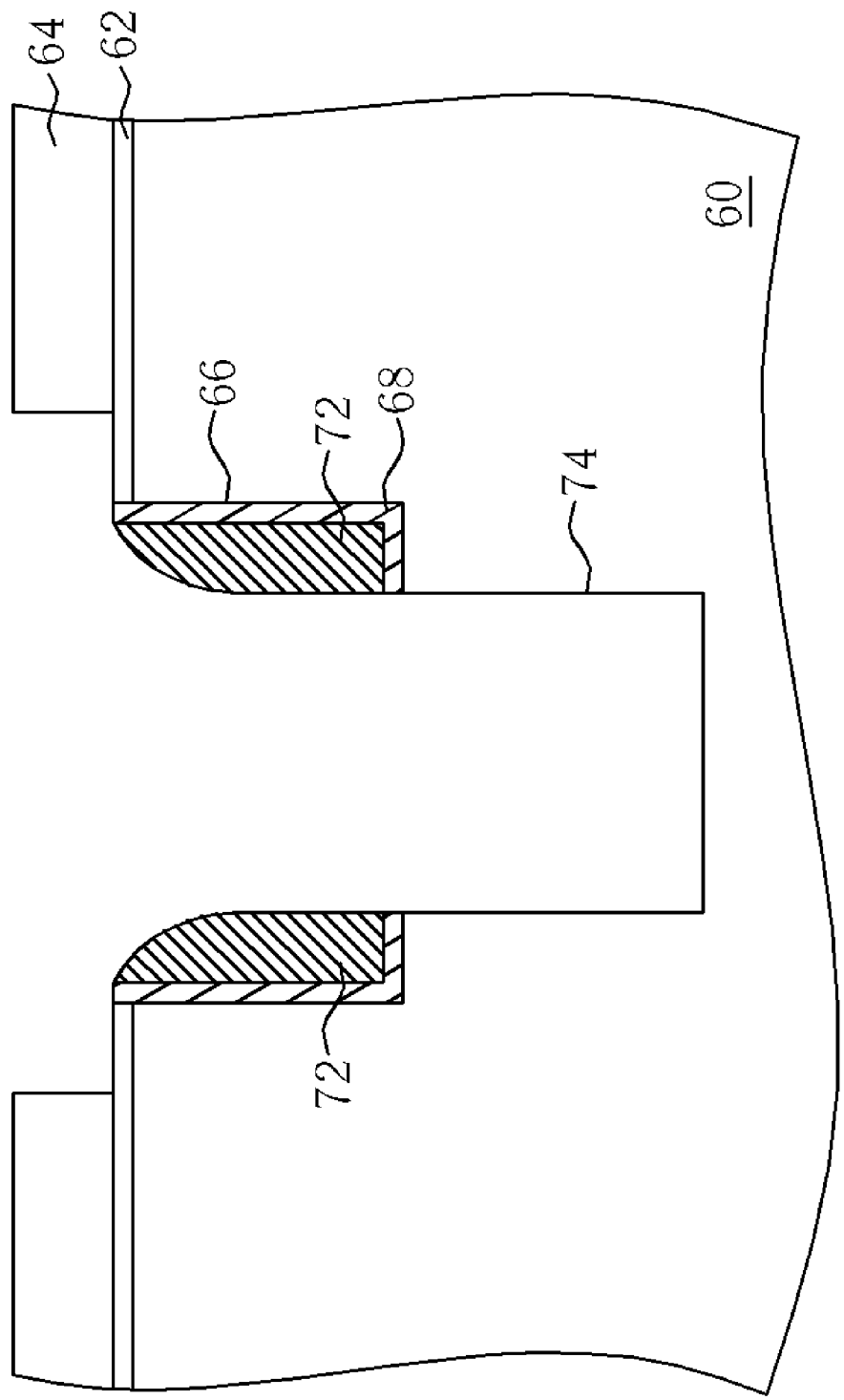

As shown in FIG. 5, the polysilicon layer 70 is removed by dry etching for forming a spacer 72 serving as a floating gate is formed on a sidewall of the first recessed trench 66. Then taking the mask layer (not shown), such as oxide layer, the pad nitride 64 and the spacer 72 as a mask, the bottom of the first recessed trench 66 is etched to form a second recessed trench 74. After that, taking the mask layer (not shown) as a mask, the pad oxide 64 is etched to expose part of the pad oxide 62 covered by the pad nitride 64. Then the mask layer is removed.

Figure 6:
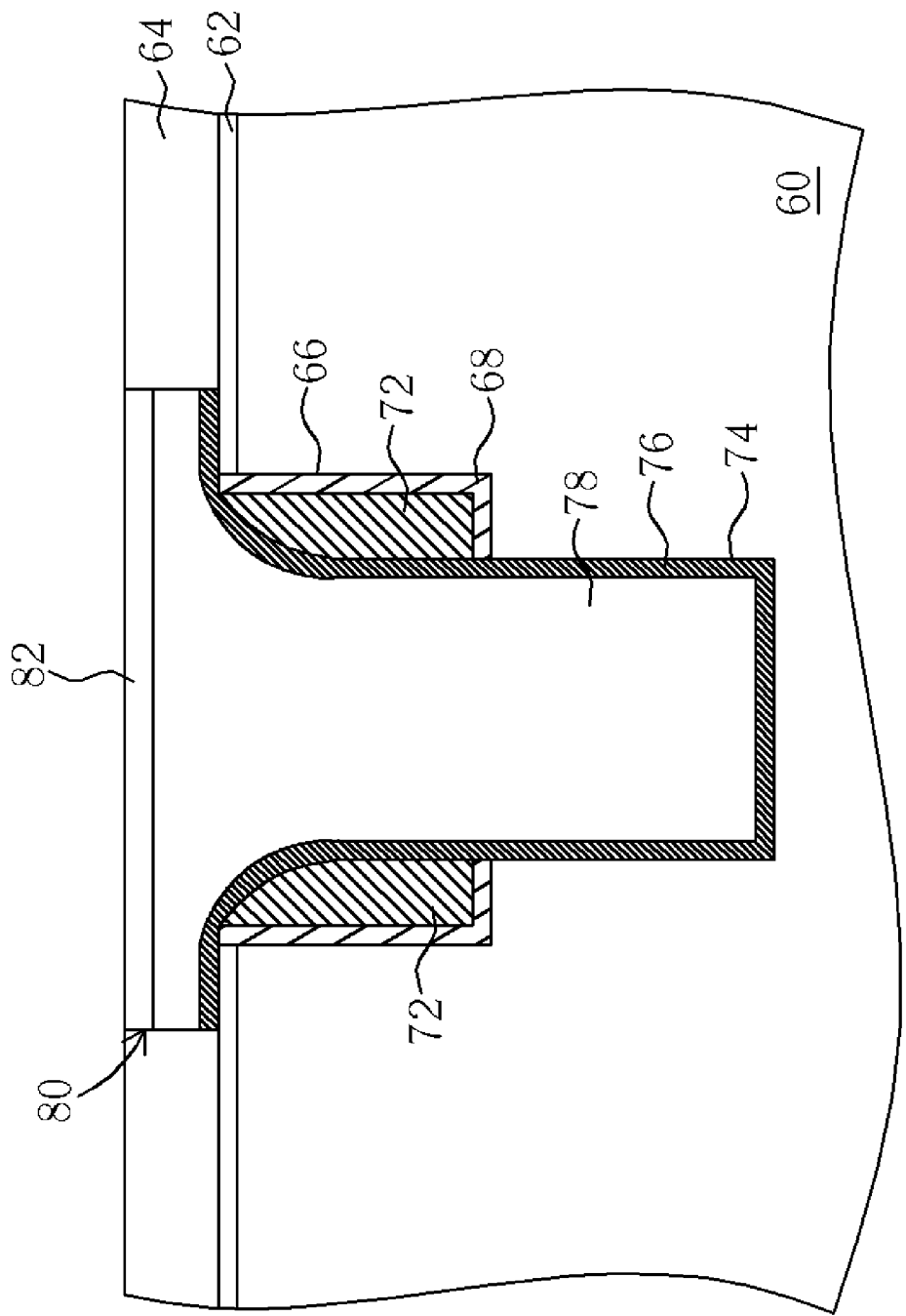

As shown in FIG. 6, an inter-gate dielectric layer 76 is formed on the surface of the spacer 72, the sidewall and the bottom of the second recessed trench 74. The inter-gate dielectric layer 76 comprises silicon oxide, silicon nitride, silicon oxide/silicon nitride, silicon nitride/silicon oxide, or silicon oxide/silicon nitride/silicon oxide. In addition, the method of forming the inter-gate dielectric layer 76 comprises forming the silicon oxide by a thermal oxidation process and forming the silicon nitride by a chemical vapor deposition process. Then, a conductive layer such as a polysilicon layer 78 is formed on the inter-gate dielectric layer 76 and the first recessed trench 66 and the second recessed trench 74 are filled up with the polysilicon layer 78. After that, the polysilicon layer 78 is polished to make the top surface of the polysilicon layer 78 aligned with the top surface of the pad nitride 64. Then, the polysilicon layer 78 is etched back to form a recessed region 80. Now the polysilicon layer 78 with the recessed region 80 serves as a control gate. Afterwards, the recessed region 80 is filled with a first dielectric layer 82 formed by a chemical vapor deposition process. Then, the first dielectric layer 82 is polished to make the surface of the first dielectric layer 82 aligned with the surface of the pad nitride 64.

Figure 7:
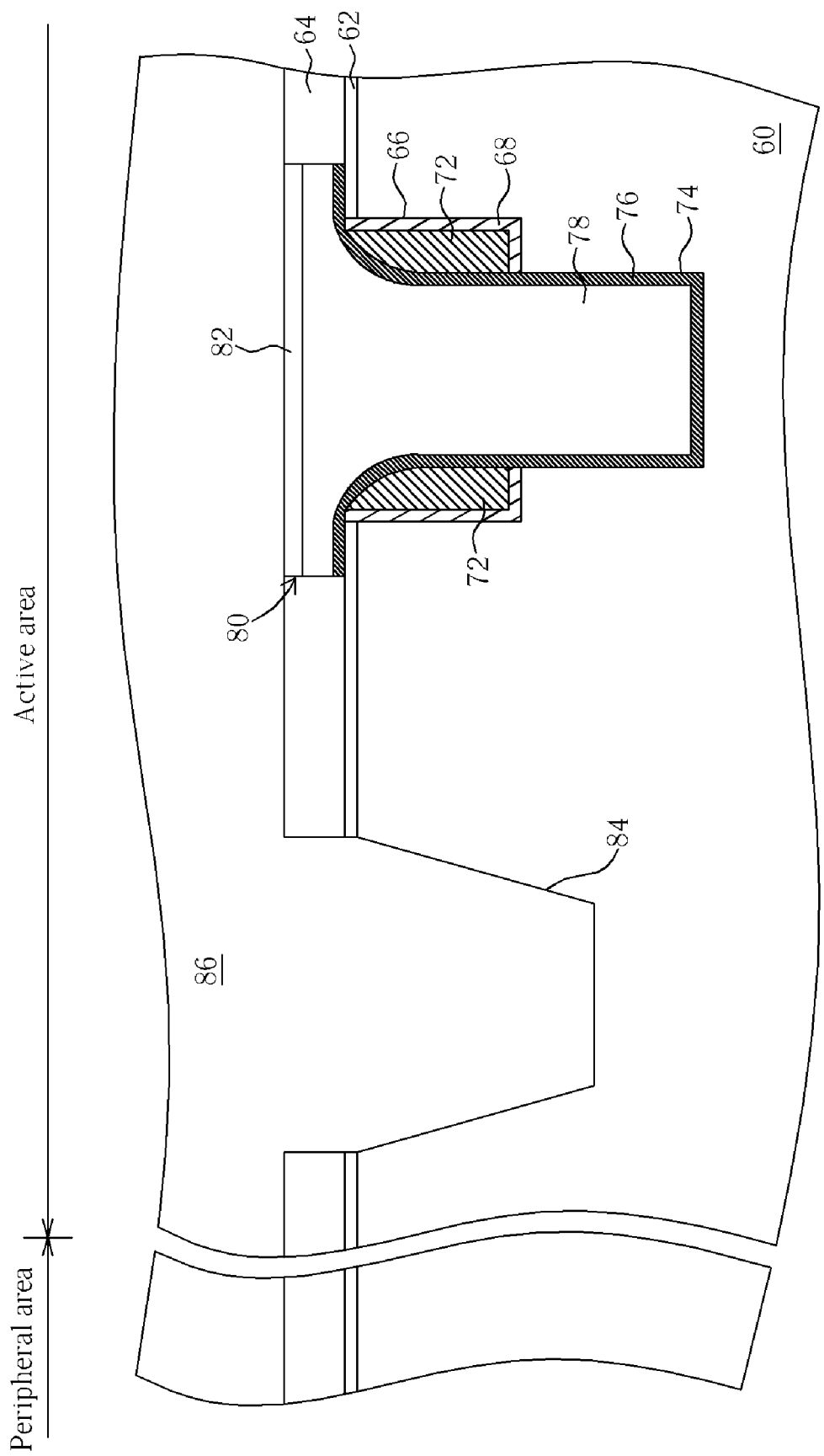

As shown in FIG. 7, an active area is defined by forming a plurality of STI trenches 84. Then, a second dielectric layer 86 is formed by a chemical vapor deposition process, wherein the surface of the pad nitride 64 and the surface of the first dielectric layer 82 is covered by the second dielectric layer 86 and the STI trench 84 is filled up with the second dielectric layer 86.

Figure 8:
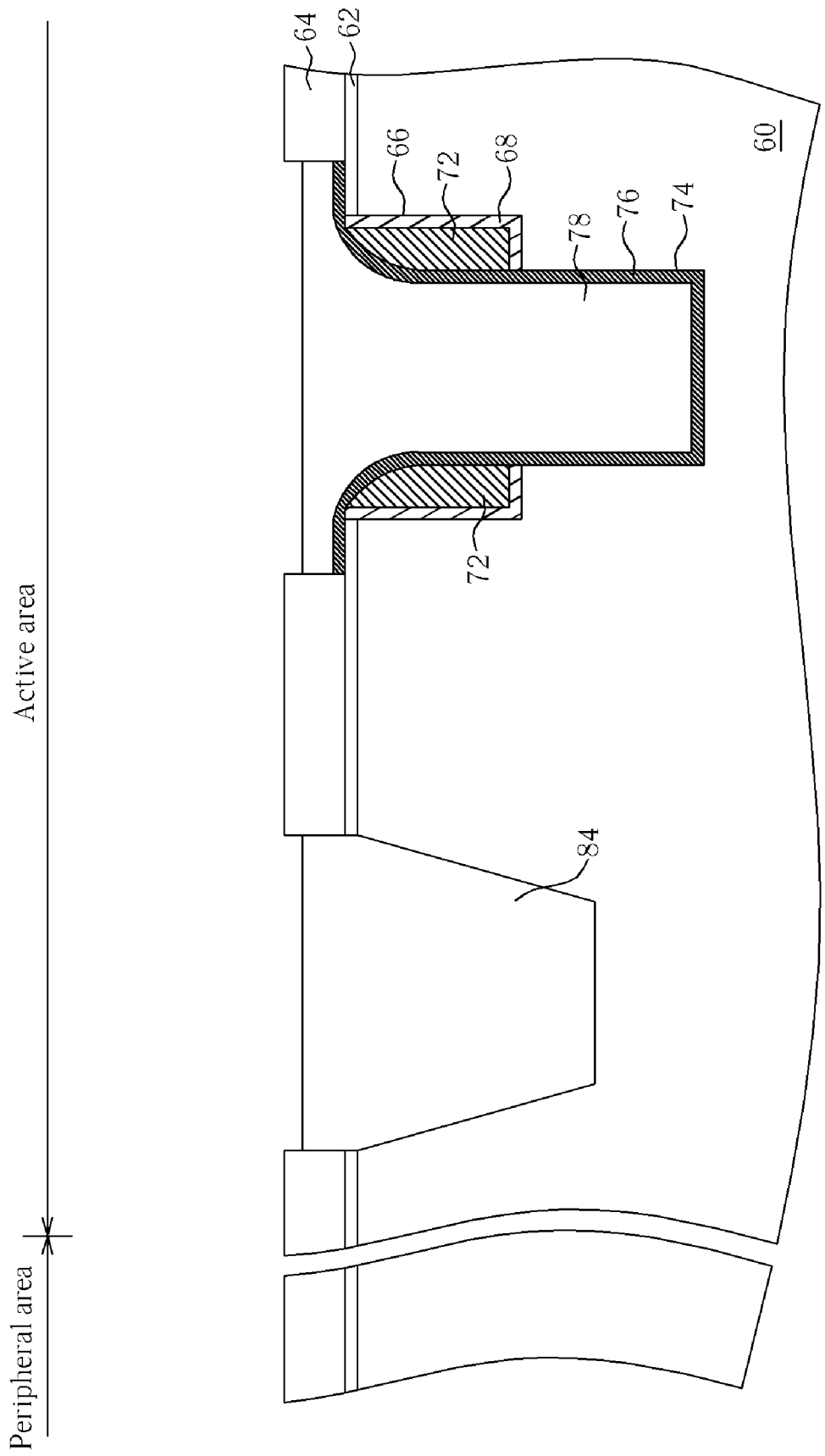

As shown in FIG. 8, the second dielectric layer 86 is polished and the top surface of the second dielectric layer 86 is aligned with the top surface of the pad nitride 64. Later, the first dielectric layer 82 is removed.

Figure 9:
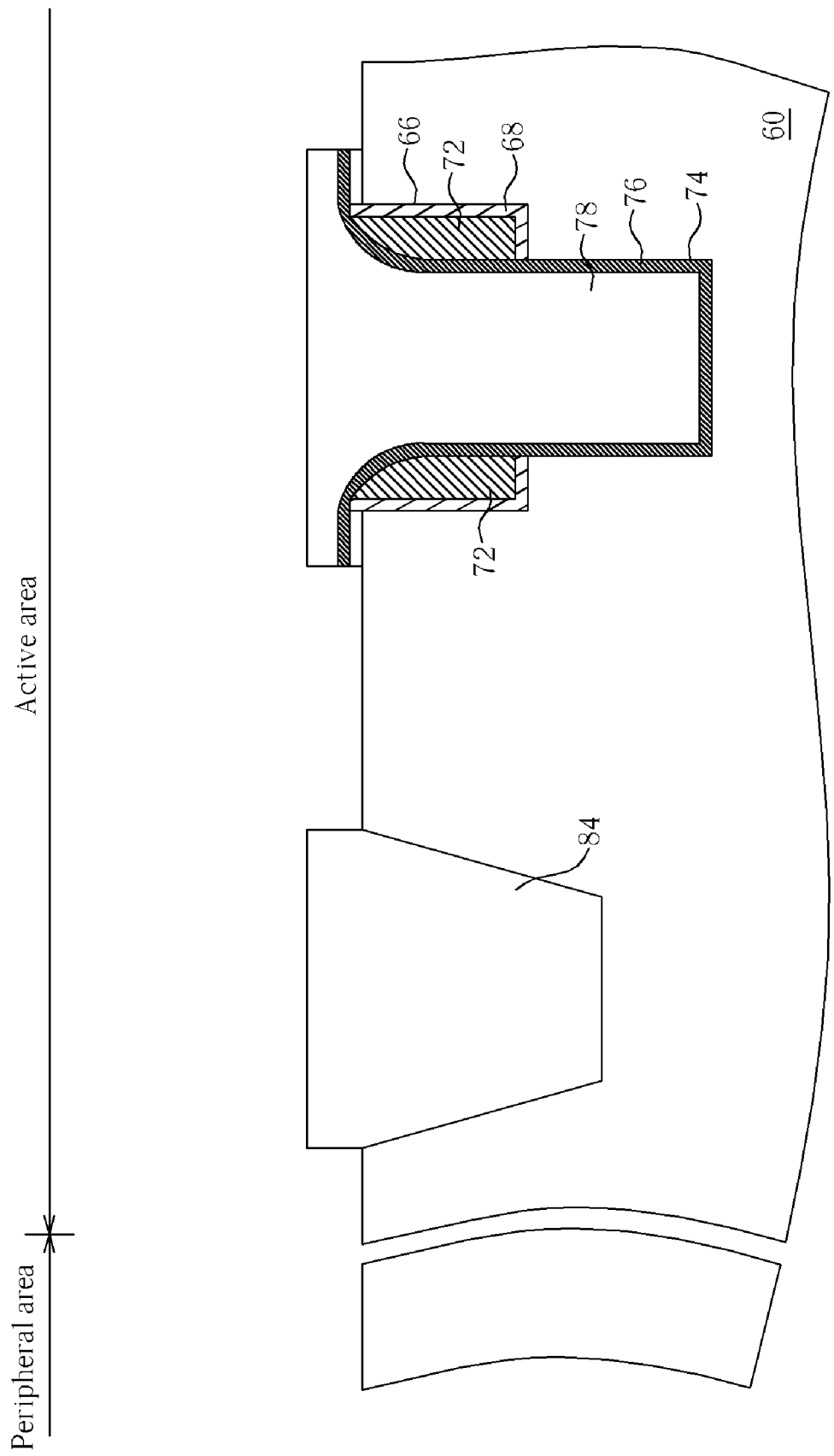
Figure 10:
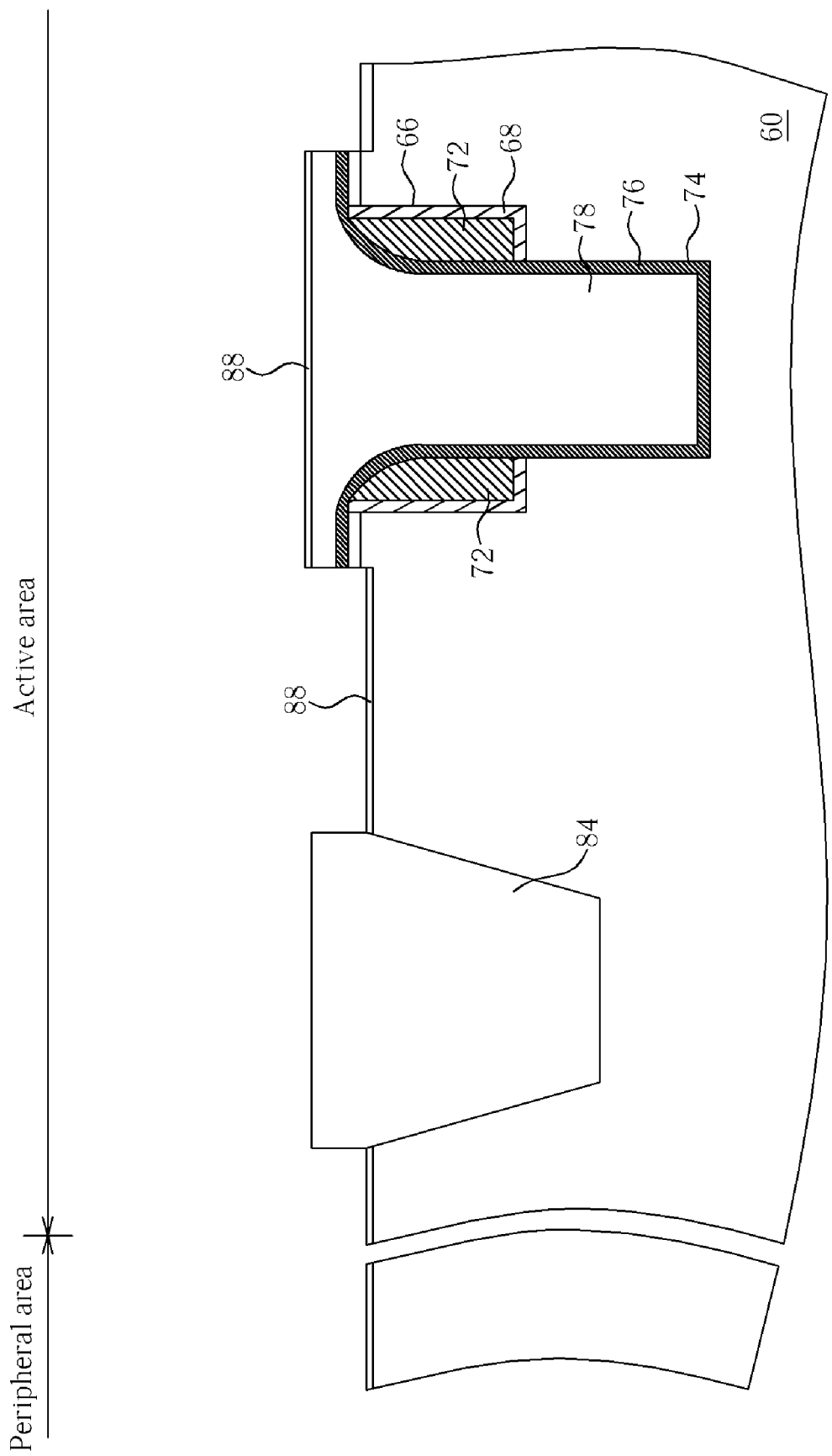

As shown in FIG. 9, the polysilicon layer 78 is etched. Then, the pad nitride 64 and the pad oxide 62 are removed. As shown in FIG. 10, a gate dielectric layer 88 is formed on the surface of the substrate 60. The method of forming the gate dielectric layer 88 comprises forming the silicon oxide a thermal oxidation process. After that, a mask such as a photo mask is formed to cover the peripheral area.

Figure 11:
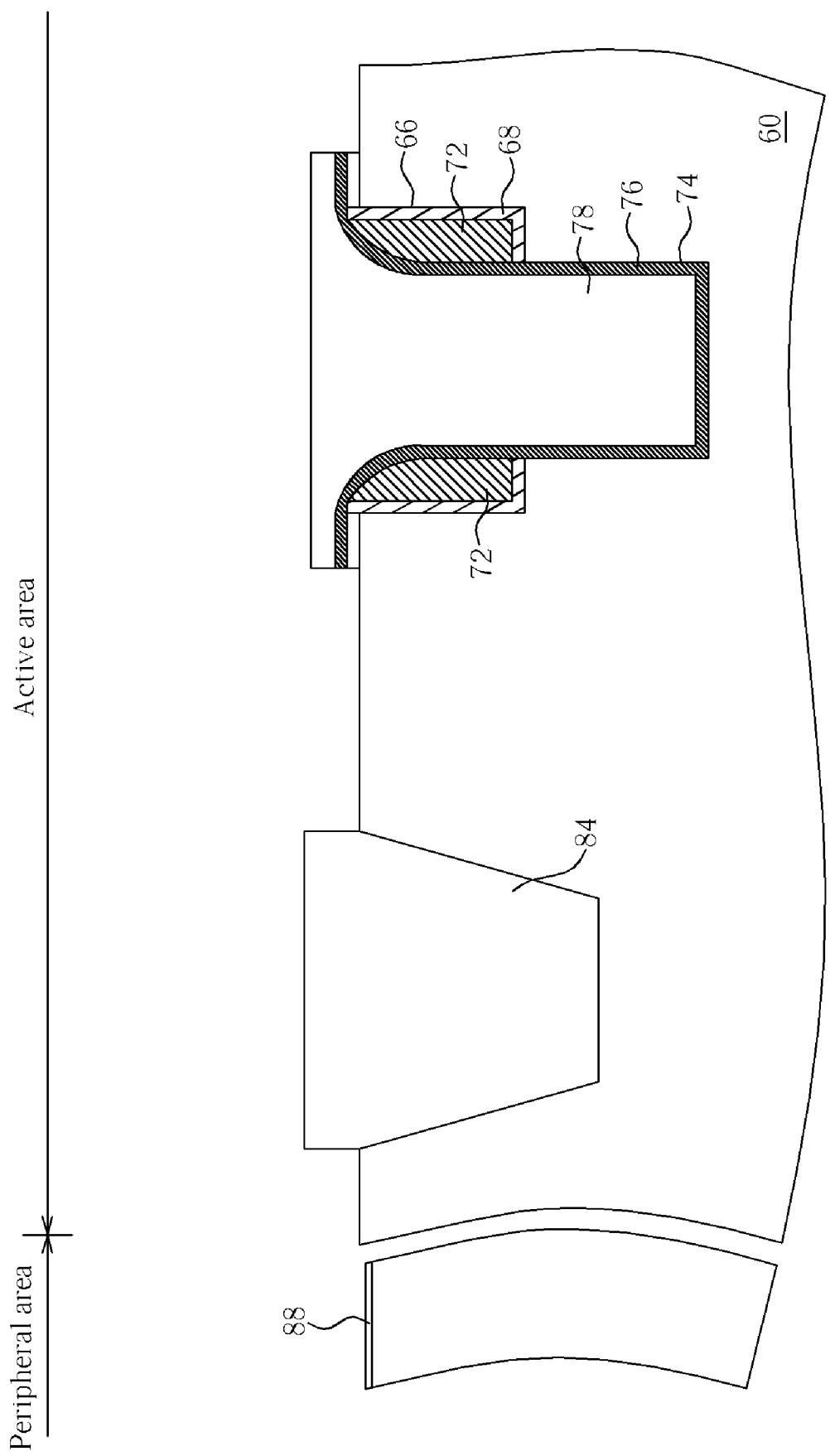
Figure 12:
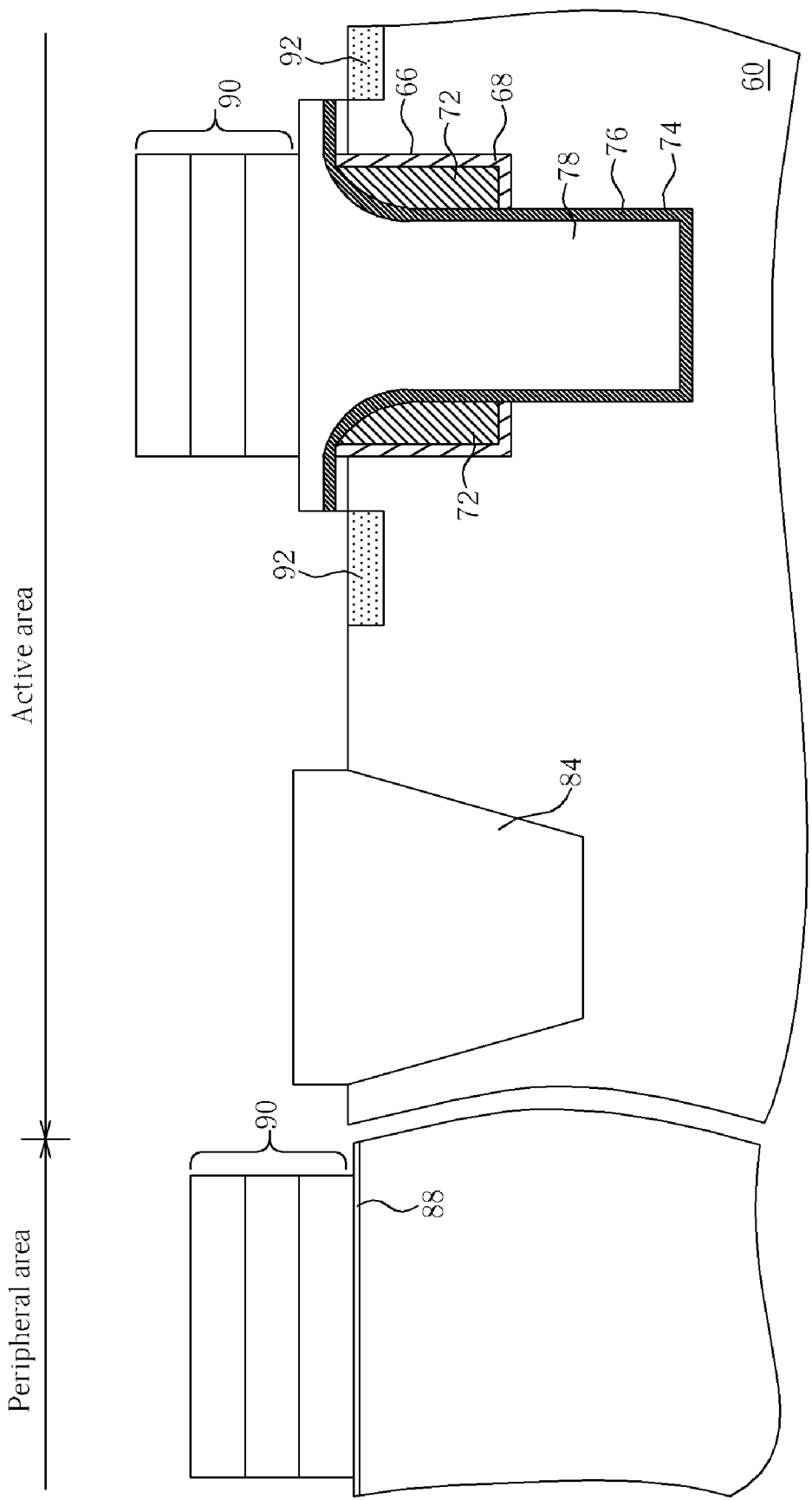

As shown in FIG. 11, the gate dielectric layer 88 not covered by the mask is etched. Then the mask is removed. As shown in FIG. 12, a gate structure 90 is formed on the peripheral area and on the polysilicon layer 78 simultaneously. After that, a source/drain doping region 92 is formed in the substrate at a side of the spacer 72.

Those skilled in the art will readily observe that numerous modifications and alterations of the device and method may be made while retaining the teachings of the invention.

What is claimed is:

1. A method of fabricating a flash structure comprising:
   providing a substrate with a pad;
   forming a first recessed trench in the substrate and the pad;
   forming a first gate dielectric layer on the surface of the first recessed trench;
   forming a spacer on a sidewall of the first recessed trench;
   forming a second recessed trench in a bottom of the first recessed trench by taking the pad and the spacer as a mask;
   forming an inter-gate dielectric layer on the surface of the spacer, the sidewall and the bottom of the second recessed trench;
   forming a first conductive layer on the inter-gate dielectric layer, wherein the first conductive layer fills the first and the second recessed trench;
   polishing the first conductive layer, and making the top surface of the first conductive layer aligned with the top surface of the pad;
   etching back the first conductive layer to form a recessed region;
   forming a first dielectric layer, wherein the first dielectric layer fills up the recessed region;
   polishing the first dielectric layer, and making the top surface of the first dielectric layer aligned with the top surface of the pad;
   forming a plurality of STI trenches in the substrate;
   forming a second dielectric layer, wherein the second dielectric layer covers the surface of the pad and the first dielectric layer, and fills up the STI trenches;
   polishing the second dielectric layer and making the top surface of the second dielectric layer aligned with the top surface of the pad;
   removing the first dielectric layer;
   etching back the first conductive layer;
   removing the pad; and
   forming a source/drain doping region in the substrate adjacent the spacer.

2. The method of fabricating a flash structure of claim 1, wherein the spacer comprises polysilicon layer.

3. The method of fabricating a flash structure of claim 1, further comprising:
   after the step of removing the pad;
   forming a second gate dielectric layer;
   forming a mask on the second gate dielectric layer, wherein the mask covers a peripheral area;
   etching the second gate dielectric layer which is not covered by the mask;
   removing the mask; and
   forming a gate structure on the peripheral area and on the first conductive layer simultaneously.

4. The method of fabricating a flash structure of claim 1, wherein the pad comprises a pad oxide and a pad nitride.

5. The method of fabricating a flash structure of claim 4, further comprises:
   before the step of forming an inter-gate dielectric layer on the surface of the spacer, the sidewall and the bottom of the second recessed trench,
   etching the pad nitride to expose the pad oxide covered by the pad nitride.

6. The method of fabricating a flash structure of claim 1, wherein the inter-gate dielectric layer comprises silicon oxide, silicon nitride, silicon oxide/silicon nitride, silicon nitride/silicon oxide, or silicon oxide/silicon nitride/silicon oxide.

7. The method of fabricating a flash structure of claim 1, wherein the first dielectric layer is formed by a chemical vapor deposition process.

8. The method of fabricating a flash structure of claim 1, wherein the second dielectric layer is formed by a chemical vapor deposition process.

* * * * *